United States Patent
Takado et al.

(10) Patent No.: US 10,062,565 B2
(45) Date of Patent: *Aug. 28, 2018

(54) NITRIDE SEMICONDUCTOR ELEMENT AND NITRIDE SEMICONDUCTOR PACKAGE

(71) Applicant: ROHM CO., LTD., Kyoto (JP)

(72) Inventors: Shinya Takado, Kyoto (JP); Norikazu Ito, Kyoto (JP); Atsushi Yamaguchi, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/870,818

(22) Filed: Jan. 12, 2018

(65) Prior Publication Data
US 2018/0158678 A1    Jun. 7, 2018

Related U.S. Application Data

(63) Continuation of application No. 15/271,759, filed on Sep. 21, 2016, now Pat. No. 9,905,419, which is a (Continued)

(30) Foreign Application Priority Data

Nov. 16, 2010    (JP) .................. 2010-255912

(51) Int. Cl.
*H01L 29/04* (2006.01)
*H01L 29/20* (2006.01)
(Continued)

(52) U.S. Cl.
CPC .... *H01L 21/02458* (2013.01); *H01L 21/0254* (2013.01); *H01L 21/0262* (2013.01); *H01L 21/02381* (2013.01); *H01L 21/02433* (2013.01); *H01L 21/02499* (2013.01); *H01L 21/02505* (2013.01); *H01L 21/02579* (2013.01);
(Continued)

(58) Field of Classification Search
CPC .... H01L 29/2003; H01L 29/04–29/045; H01L 29/155; H01L 29/7787; H01L 29/7783; H01L 29/7786; H01L 21/02027; H01L 21/02433; H01L 21/02516; H01L 21/024609
See application file for complete search history.

(56) References Cited

U.S. PATENT DOCUMENTS 6,072,197 A    6/2000 Horino et al.
6,548,333 B2    4/2003 Smith
(Continued)

FOREIGN PATENT DOCUMENTS

JP    2008-166349 A    7/2008

*Primary Examiner* — Maliheh Malek
(74) *Attorney, Agent, or Firm* — Rabin & Berdo, P.C.

(57) ABSTRACT

A nitride semiconductor element capable of accommodating GaN electron transfer layers of a wide range of thickness, so as to allow greater freedom of device design, and a nitride semiconductor element package with excellent voltage tolerance performance and reliability. On a substrate, a buffer layer including an AlN layer, a first AlGaN layer and a second AlGaN layer is formed. On the buffer layer, an element action layer including a GaN electron transfer layer and an AlGaN electron supply layer is formed. Thus, an HEMT element is constituted.

21 Claims, 9 Drawing Sheets

Related U.S. Application Data continuation of application No. 15/018,204, filed on Feb. 8, 2016, now Pat. No. 9,472,623, which is a continuation of application No. 13/297,141, filed on Nov. 15, 2011, now Pat. No. 9,257,548.

(51) Int. Cl.

| | | |
|---|---|---|
| *H01L 29/778* | (2006.01) | |
| *H01L 21/02* | (2006.01) | |
| *H01L 23/495* | (2006.01) | |
| *H01L 29/205* | (2006.01) | |
| *H01L 29/66* | (2006.01) | |
| *H01L 21/48* | (2006.01) | |
| *H01L 21/56* | (2006.01) | |
| *H01L 23/31* | (2006.01) | |
| *H01L 29/15* | (2006.01) | |
| *H01L 29/423* | (2006.01) | |
| *H01L 29/417* | (2006.01) | |
| *H01L 23/00* | (2006.01) | |

(52) U.S. Cl.
CPC ........ *H01L 21/4825* (2013.01); *H01L 21/565* (2013.01); *H01L 23/3114* (2013.01); *H01L 23/4952* (2013.01); *H01L 23/49562* (2013.01); *H01L 29/045* (2013.01); *H01L 29/154* (2013.01); *H01L 29/2003* (2013.01); *H01L 29/205* (2013.01); *H01L 29/41758* (2013.01); *H01L 29/42316* (2013.01); *H01L 29/66462* (2013.01); *H01L 29/7784* (2013.01); *H01L 29/7787* (2013.01); H01L 24/06 (2013.01); H01L 24/45 (2013.01); H01L 24/48 (2013.01); H01L 24/49 (2013.01); H01L 2224/06051 (2013.01); H01L 2224/451 (2013.01); H01L 2224/48257 (2013.01); H01L 2224/49111 (2013.01); H01L 2924/01012 (2013.01); H01L 2924/01013 (2013.01); H01L 2924/01014 (2013.01); H01L 2924/01019 (2013.01); H01L 2924/01028 (2013.01); H01L 2924/12032 (2013.01)

(56) References Cited

U.S. PATENT DOCUMENTS

| | | | | |
|---|---|---|---|---|
| 6,680,959 | B2* | 1/2004 | Tanabe | H01S 5/32341 372/45.01 |
| 6,777,278 | B2 | 8/2004 | Smith | |
| 7,030,428 | B2 | 4/2006 | Saxler | |
| 7,873,088 | B2 | 1/2011 | Yoshizumi et al. | |
| 8,153,515 | B2 | 4/2012 | Saxler | |
| 8,159,004 | B2 | 4/2012 | Sato | |
| 8,294,181 | B2 | 10/2012 | Kikkawa et al. | |
| 8,304,811 | B2 | 11/2012 | Zhang | |
| 8,344,356 | B2 | 1/2013 | Sakamoto et al. | |
| 8,390,091 | B2 | 3/2013 | Renaud | |
| 8,405,064 | B2 | 3/2013 | Yamaguchi et al. | |
| 8,481,991 | B2 | 7/2013 | Ohta et al. | |
| 8,785,943 | B2* | 7/2014 | Shioda | H01L 21/02381 257/76 |
| 9,257,548 | B2* | 2/2016 | Takado | H01L 21/0262 |
| 9,312,373 | B2 | 4/2016 | Imada | |
| 9,472,623 | B2* | 10/2016 | Takado | H01L 21/02579 |
| 9,905,419 | B2* | 2/2018 | Takado | H01L 21/02458 |
| 2002/0027933 | A1* | 3/2002 | Tanabe | H01S 5/32341 372/45.01 |
| 2004/0012015 | A1 | 1/2004 | Saxler | |
| 2004/0061244 | A1 | 4/2004 | Nishijima et al. | |
| 2004/0072383 | A1* | 4/2004 | Nagahama | H01L 21/76251 438/47 |
| 2005/0274980 | A1* | 12/2005 | Miyoshi | H01L 29/7787 257/192 |
| 2006/0073621 | A1 | 4/2006 | Kneissel et al. | |
| 2006/0102926 | A1 | 5/2006 | Kikkawa et al. | |
| 2006/0121682 | A1 | 6/2006 | Saxler | |
| 2007/0018199 | A1 | 1/2007 | Sheppard et al. | |
| 2008/0217645 | A1 | 9/2008 | Saxler et al. | |
| 2008/0220555 | A1 | 9/2008 | Saxler et al. | |
| 2008/0308836 | A1* | 12/2008 | Nakahara | H01L 21/0237 257/103 |
| 2009/0045438 | A1 | 2/2009 | Inoue et al. | |
| 2009/0095973 | A1 | 4/2009 | Tanaka et al. | |
| 2009/0101927 | A1 | 4/2009 | Kohda | |
| 2009/0121240 | A1 | 5/2009 | Shakuda et al. | |
| 2009/0148975 | A1 | 6/2009 | Kohda | |
| 2009/0161711 | A1 | 6/2009 | Kubota | |
| 2009/0238227 | A1 | 9/2009 | Kubota et al. | |
| 2010/0051962 | A1 | 3/2010 | Kikkawa et al. | |
| 2010/0096615 | A1 | 4/2010 | Okamoto et al. | |
| 2010/0187570 | A1 | 7/2010 | Saxler et al. | |
| 2010/0244098 | A1 | 9/2010 | Yokoyama | |
| 2010/0295054 | A1 | 11/2010 | Okamoto et al. | |
| 2011/0001127 | A1 | 1/2011 | Sakamoto et al. | |
| 2011/0013657 | A1 | 1/2011 | Sumitomo et al. | |
| 2011/0031532 | A1 | 2/2011 | Kikkawa et al. | |
| 2011/0101391 | A1* | 5/2011 | Miki | C23C 16/0272 257/94 |
| 2011/0147763 | A1 | 6/2011 | Hanawa et al. | |
| 2011/0212560 | A1 | 9/2011 | Sumitomo et al. | |
| 2011/0235665 | A1 | 9/2011 | Simon et al. | |
| 2011/0272665 | A1 | 11/2011 | Yamaguchi et al. | |
| 2011/0309328 | A1 | 12/2011 | Kyono et al. | |
| 2011/0312159 | A1 | 12/2011 | Saxler et al. | |
| 2012/0025205 | A1 | 2/2012 | Nakata et al. | |
| 2012/0056156 | A1* | 3/2012 | Kikuchi | H01L 33/04 257/13 |
| 2012/0091463 | A1* | 4/2012 | Yokogawa | H01L 21/0237 257/76 |
| 2012/0119219 | A1* | 5/2012 | Takado | H01L 21/02579 257/76 |
| 2012/0126239 | A1 | 5/2012 | Keller et al. | |
| 2012/0168753 | A1* | 7/2012 | Sanga | H01L 33/02 257/52 |
| 2012/0189029 | A1 | 7/2012 | Kashiwagi et al. | |
| 2012/0211759 | A1 | 8/2012 | Liu et al. | |
| 2012/0213240 | A1 | 8/2012 | Bhat et al. | |
| 2012/0213242 | A1 | 8/2012 | Tanaka et al. | |
| 2012/0280244 | A1 | 11/2012 | Hwang et al. | |
| 2012/0280278 | A1 | 11/2012 | Curatola et al. | |
| 2012/0315743 | A1 | 12/2012 | Kikkawa et al. | |
| 2012/0327967 | A1* | 12/2012 | Enya | H01L 21/02389 372/45.011 |
| 2013/0016751 | A1 | 1/2013 | Takado et al. | |
| 2013/0026489 | A1 | 1/2013 | Gambin et al. | |
| 2013/0062612 | A1* | 3/2013 | Shioda | H01L 21/02381 257/76 |
| 2013/0105811 | A1* | 5/2013 | Ando | H01L 29/2003 257/76 |
| 2013/0259080 | A1 | 10/2013 | Ohta et al. | |
| 2015/0115327 | A1 | 4/2015 | Briere | |
| 2015/0155684 | A1 | 6/2015 | Kashiwagi et al. | |
| 2015/0279982 | A1 | 10/2015 | Yamamoto et al. | |
| 2016/0064488 | A1 | 3/2016 | Takado et al. | |
| 2016/0155807 | A1* | 6/2016 | Takado | H01L 21/02579 257/17 |
| 2017/0011911 | A1* | 1/2017 | Takado | H01L 21/02579 |

* cited by examiner

NITRIDE SEMICONDUCTOR ELEMENT AND NITRIDE SEMICONDUCTOR PACKAGE

CROSS-REFERENCE TO RELATED APPLICATIONS

The present application is a Continuation Application of co-pending U.S. application Ser. No. 15/271,759, filed on Sep. 21, 2016, and allowed on Oct. 26, 2017, which is a Continuation Application of co-pending U.S. application Ser. No. 15/018,204, filed on Feb. 8, 2016, now U.S. Pat. No. 9,472,623, issued on Oct. 18, 2016, which is a Continuation Application of U.S. application Ser. No. 13/297,141, filed on Nov. 15, 2011, now U.S. Pat. No. 9,257,548, issued on Feb. 9, 2016. This application claims the benefit of priority of Japanese Patent Application No. 2010-255912, filed on Nov. 16, 2010. The disclosures of these prior applications are incorporated by reference herein.

BACKGROUND OF THE INVENTION

Description of the Related Art

The so-called group III nitride semiconductor refers to a semiconductor formed by using nitrogen as a group V element in a group III-V semiconductor. Representative examples are AlN, GaN, and InN, and generally, may be denoted as $Al_xIn_yGa_{1-x-y}N$ ($0 \leq x \leq 1$, $0 \leq y \leq 1$, $0 \leq x+y \leq 1$).

This type of group III nitride semiconductor has physical properties suitable for us application in high-temperature, high-power, high-frequency devices. In view of these physical properties, the group III nitride semiconductor is used as a semiconductor in devices such as a High Electron Mobility Transistor (HEMT).

For example, an HEMT having a Si substrate, an AlN layer, an AlGaN layer (with an Al component of greater than 0.3 and below 0.6), a GaN layer and an AlGaN electron supply layer is proposed. The AlN layer, the AlGaN layer, the GaN layer and the AlGaN electron supply layer are sequentially laminated on the Si substrate through epitaxial growth (referring to a patent document of Japanese Patent Publication No. 2008-166349).

SUMMARY OF THE INVENTION

However, in the HEMT of Patent Document 1, the difference in lattice constant between the AlGaN layer and the GaN layer is large, so if a GaN layer with a large thickness is laminated, lattice relaxation of GaN is caused, the compression stress applied on the GaN layer disappears, and a tensile stress is generated due to the difference in linear expansion coefficient between the Si substrate and GaN. Consequently, fine cracks (alligator cracks) are generated on the GaN layer. This imposes practical limits on GaN layer thickness, thus constraining device design.

Therefore, the present invention is directed to a nitride semiconductor element capable of accommodating GaN electron transfer layers of a wide range of thickness, so as to allow greater freedom of device design.

The present invention is further directed to a nitride semiconductor element package with excellent voltage withstanding performance and reliability.

In order to achieve the objectives, a model of Technical Solution 1 employs a nitride semiconductor element, which includes: a Si substrate; a buffer layer, including an AlN layer formed on a primary surface of the Si substrate and an AlGaN deposit layer formed by laminating multiple AlGaN layers on the AlN layer; a Group III-nitride electron transfer layer, formed on the AlGaN deposit layer; and a Group III-nitride electron supply layer, formed on the Group III-nitride electron transfer layer. In the AlGaN deposit layer, the Al component of a reference AlGaN layer is lower than the Al component of an AlGaN layer with respect to the reference AlGaN layer being more close to a side of the AlN layer. In other words, multiple AlGaN layers preferably include a first AlGaN layer, and a second AlGaN layer, in which the second AlGaN layer is configured at an opposite side of the AlN layer (the GaN electron transfer layer side) relative to the first AlGaN layer, and the Al component of the second AlGaN layer is lower than that of the first AlGaN layer.

According to their manner of constitution, the multiple AlGaN layers are formed such that the closer to the Group III-nitride electron transfer layer a layer is, the smaller the Al component becomes. Therefore, the lattice constant of the AlGaN layer can gradually increase from an initial value close to the lattice constant of AlN to a value close to the lattice constant of the Group III-nitride electron transfer layer. Therefore, the difference in lattice constant between the Group III-nitride electron transfer layer and the AlGaN layer connected to the top layer of the Group III-nitride electron transfer layer can be reduced. In this way, freedom of design is permitted in selecting the thickness of the Group III-nitride electron transfer layer, such as a thick Group III-nitride electron transfer layer to provide improved performance of the element in voltage tolerance.

However, in the case where the GaN crystalline is to be laminated on the Si substrate through epitaxial growth, sometimes during cooling or after cooling after the epitaxial growth, a large tensile stress is generated on the GaN layer due to the difference in thermal expansion coefficient between the Si substrate and the GaN layer (that is, the difference in contraction rate during cooling). Consequently, fine cracks (alligator cracks) are generated on the GaN layer and the Si substrate becomes warped.

According to the present invention, the AlN layer is formed on the Si substrate, and the AlGaN deposit layer is disposed between the AlN layer and the Group III-nitride electron transfer layer. Furthermore, in the AlGaN deposit layer, multiple AlGaN layers are formed in such a manner that the closer to the Group III-nitride electron transfer layer a layer is, the smaller the Al component becomes. Therefore, the compression stress (strain) applied to the AlGaN layer due to the difference in lattice constant between the AlN layer and the AlGaN layer at the bottom layer can be transferred to the AlGaN layer at the top layer. In this way, even if a tensile stress is generated on the Group III-nitride electron transfer layer, the tensile stress may also be mitigated through the compression stress applied to the Group III-nitride electron transfer layer from the AlN layer and the AlGaN buffer layer. Therefore, the alligator cracks of the Group III-nitride electron transfer layer and the warp of the Si substrate can be alleviated.

Furthermore, in the AlGaN deposit layer, as shown in Technical Solution 2, the difference in Al component (%) between the reference AlGaN layer and the AlGaN layer configured on a surface of the AlN layer connected the reference AlGaN layer preferably is 10% or more.

As a result, a difference in lattice constant between the reference AlGaN layer and the AlGaN layer connected to the reference AlGaN layer is definitely generated.

For example, if the difference in Al component (%) between the reference AlGaN layer and the AlGaN layer configured on the surface of the AlN layer connected the reference AlGaN layer is about 1%, sometimes the lattice constant of the reference AlGaN layer will be consistent with the lattice constant of the AlGaN layer connected to the reference AlGaN layer. Therefore, the difference in lattice constant between the AlGaN layer at the top layer and the Group III-nitride electron transfer layer increases, resulting in complete lattice relaxation, so it is difficult to transfer the compression stress (strain) from the buffer layer to the Group III-nitride electron transfer layer.

Therefore, in comparison with the case where a consistent lattice constant is generated, the model of Technical Solution 2 provides a reduced difference in lattice constant between the Group III-nitride electron transfer layer and the AlGaN layer. Therefore, the compression stress (strain) may be effectively transferred from the buffer layer to the Group III-nitride electron transfer layer, thereby alleviating the problems of alligator cracks appearing in the Group III-nitride electron transfer layer and warping of the Si substrate.

For example, as shown in Technical Solution 3, the AlGaN deposit layer may also include a construction formed of the first AlGaN layer with an Al component of 50% and the second AlGaN layer with an Al component of 20% sequentially laminated from the start of the AlN layer.

Furthermore, as shown in Technical Solution 4, the AlGaN deposit layer may also include a construction formed of the first AlGaN layer with an Al component of 80%, the second AlGaN layer with an Al component of 60%, the third AlGaN layer with an Al component of 40% and the fourth AlGaN layer with an Al component of 20% sequentially laminated from the start of the AlN layer.

Furthermore, the model of Technical Solution 5 is the nitride semiconductor according to any one of Technical Solutions 1 to 4, in which the plane orientation of the primary surface of the buffer layer is the c-plane, and in the AlGaN deposit layer, the a-axis average lattice constant of the reference AlGaN layer is greater than the a-axis in-plane lattice constant of the AlGaN layer configured on the surface of the AlN layer connected the reference AlGaN layer, and is lower than the original a-axis average lattice constant of the reference AlGaN layer.

In this way, the a-axis average lattice constant of the reference AlGaN layer is greater than the a-axis in-plane lattice constant of the AlGaN layer connected to the reference AlGaN layer, and is lower than the original a-axis average lattice constant of the reference AlGaN layer (the a-axis lattice constant under the state of no-strain). Thus, the a-axis compression stress due to inconsistency of the a-axis lattice constant of the AlGaN layer configured on the surface of the AlN layer connected the reference AlGaN layer is applied to the reference AlGaN layer. Furthermore, the a-axis compression stress can be transferred to the AlGaN layer at the top layer. Therefore, even if the a-axis tensile stress is generated on the Group III-nitride electron transfer layer, the a-axis tensile stress may also be mitigated by applying the a-axis compression stress to the Group III-nitride electron transfer layer from the AlN layer and the AlGaN buffer layer.

The so-called in-plane lattice constant refers to the lattice constant of an interface between the AlGaN layer connected to the side of the AlN layer of the reference AlGaN layer and the reference AlGaN layer.

Alternatively, the primary surface of the Si substrate can furthermore be the (111) plane as shown in Technical Solution 6.

The degree of strain of the c-axis lattice constant of the Group III-nitride electron transfer layer preferably is −0.07% or more, as shown in Technical Solution 7.

Thus, alligator cracks can be prevented from forming on the Group III-nitride electron transfer layer.

The thickness of the Group III-nitride electron transfer layer preferably is 500 nm to 2000 nm, as shown in Technical Solution 8.

The thickness of the AlN layer preferably is 50 nm to 200 nm, as shown in Technical Solution 9.

The thickness of the first AlGaN layer preferably is 100 nm to 500 nm, as shown in Technical Solution 10.

The thickness of the second AlGaN layer preferably is 100 nm to 500 nm, as shown in Technical Solution 11.

The model of Technical Solution 12 is a nitride semiconductor package, which includes the nitride semiconductor element according to any one of Technical Solutions 1 to 11 and a resin package formed in a manner of covering the nitride semiconductor element.

According to this way of using the nitride semiconductor element of the present invention, the degree of design freedom in the thickness of the Group III-nitride electron transfer layer is high, so a package with excellent voltage tolerance performance can be provided. Furthermore, the problems of alligator cracks forming on the Group III-nitride electron transfer layer and warping of the Si substrate of the nitride semiconductor element can be alleviated, so a package with high reliability can be provided.

PREFERRED EMBODIMENT OF THE PRESENT INVENTION

Implementation manners of the present invention are illustrated in detail below with reference to the accompanying drawings.

Figure 1:
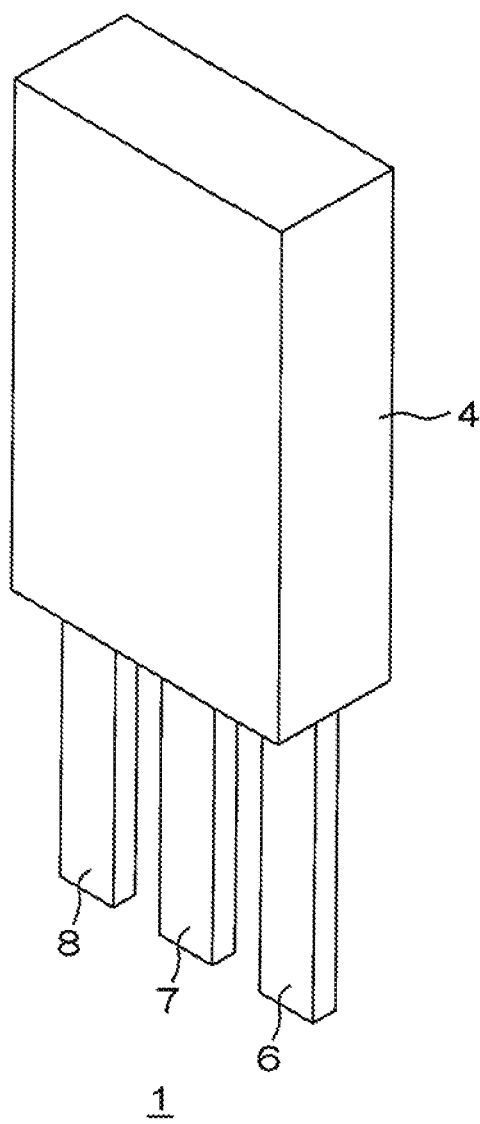
FIG. 1 is a schematic global view of an HEMT package according to an implementation manner of the present invention.
Figure 2:
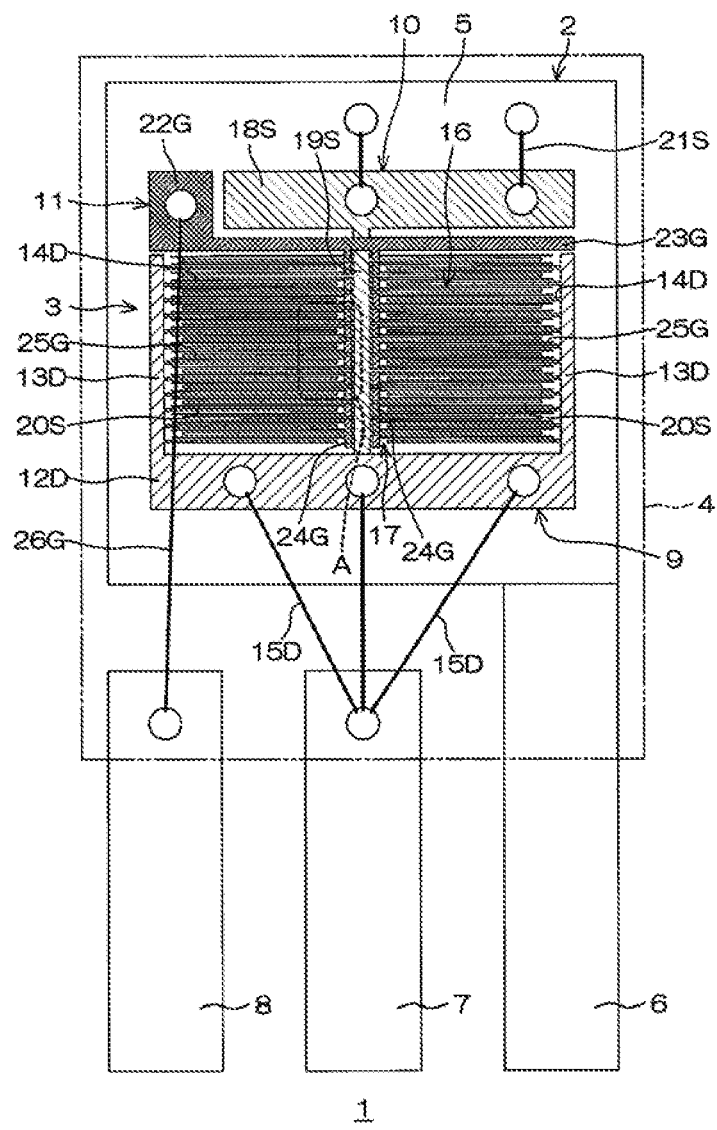
FIG. 2 is a perspective view denoting the inside of the HEMT package shown in FIG. 1.
Figure 3:
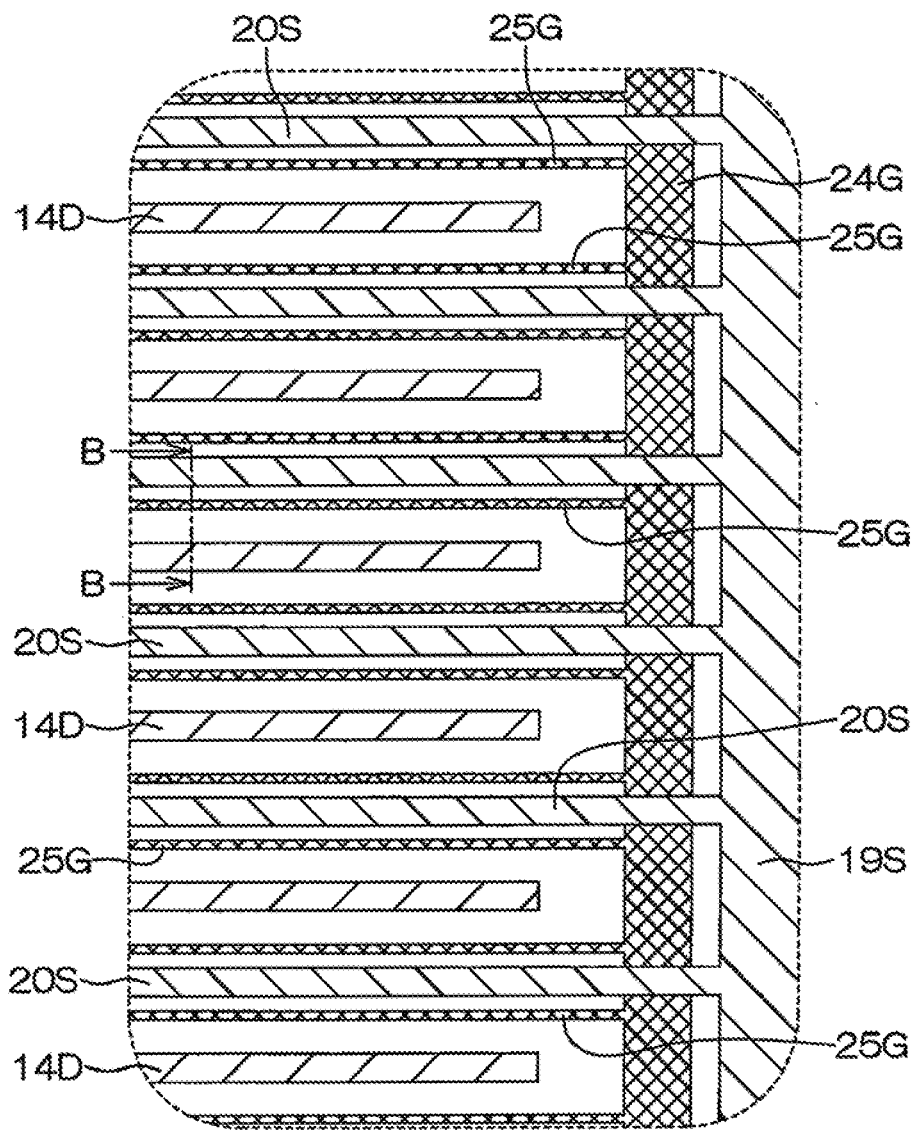
FIG. 3 is an enlarged view of a part surrounded by dashed line A of FIG. 2.

FIG. 1 is a schematic global view of an HEMT package according to an implementation manner of the present invention. FIG. 2 is a perspective view denoting the inside of the HEMT package shown in FIG. 1. FIG. 3 is an enlarged view of a part surrounded by dashed line A of FIG. 2.

As an example of a nitride semiconductor package according to the present invention, an HEMT package 1 includes a terminal frame 2, an HEMT element 3 (chip), and a resin package 4.

The terminal frame 2 is formed in the shape of a metal plate. The terminal frame 2 has the shape of a quadrangle from the top view, and includes a base portion 5 supporting the HEMT package 1; a source terminal 6 integrally formed with the base portion 5; and a drain terminal 7 and a gate terminal 8 formed separately from the base portion 5.

The source terminal 6, the drain terminal 7 and the gate terminal 8 are respectively formed in a top view straight line shape including one end and the other end, and the ends are parallel to each other in the same order. In the multiple terminals 6 to 8, only one end of the source terminal 6 integrally formed with the base portion 5 is connected to a corner portion of the base portion 5. In the other terminals 7 to 8, the gate terminal 8 is configured in a manner that one end thereof is opposite to another corner portion of the base portion 5 adjacent to the corner portion connected to the source terminal 6, and the drain terminal 7 is configured between the gate terminal 8 and the source terminal 6.

The HEMT element 3 is an example of the nitride semiconductor element according to the present invention, and includes a drain pad 9, a source pad 10 and a gate pad 11. The drain pad 9, the source pad 10 and the gate pad 11 are each formed in the shape of a metal plate, and are configured separately from each other.

The drain pad 9 integrally includes a welding portion 12D, a support arm portion 13D and an electrode portion 14D.

The welding portion 12D of the drain pad 9 is formed in a top view straight line shape including one end and the other end, and extending in a direction of transversely cutting the terminals 6 to 8 of the terminal frame 2. The welding portion 12D is electrically connected to the drain terminal 7 through welding wires 15D (3 connection wires in FIG. 2).

The support arm portions 13D of the drain pad 9 are formed as a pair in a top view straight line shape extending in a direction far from the terminals 6 to 8 from the start of one end and the other end of the welding portion 12D and are parallel to each other. The drain pad 9 divides an element area 16 from which a movable end (the other end) of the support arm portion 13D is exposed and surrounded to form a top view concave shape (U-shaped) through the welding portion 12D and a pair of support arm portions 13D.

The electrode portion 14D of the drain pad 9 is disposed in the element area 16, and is in a stripe shape extending from one support arm portion 13D to the other support arm portion 13D, thus forming multiple electrode portions 14D. Between a front end connected to an electrode portion 14D on a support arm portion 13D and a front end connected to an electrode portion 14D on the other support arm portion 13D, a gap 17 with a specific width is disposed.

The source pad 10 integrally includes a welding portion 18S, a support arm portion 19S and an electrode portion 20S.

The welding portion 18S of the source pad 10 forms a top view straight line shape extending in parallel to the welding portion 12D of the drain pad 9 at the exposure end of the element area 16. The welding portion 18S is electrically connected to the base portion 5 through welding wires 21S (2 connection wires in FIG. 2). In this way, the welding portion 18S of the source pad 10 is electrically connected to the source terminal 6 integrally formed with the base portion 5.

The support arm portion 19S of the source pad 10 is formed as one piece in a manner extending in the direction transversely cutting the electrode portion 14D of the drain pad 9 in the gap 17 of the electrode portion 14D of the drain pad 9.

The electrode portion 20S of the source pad 10 is formed as multiple pieces in a stripe shape extending in two directions from the support arm portion 19S to the support arm portions 13D of the drain pad 9. An electrode portion 20S is disposed between the electrode portions 14D of the drain pad 9.

The gate pad 11 integrally includes a welding portion 22G, a first support arm portion 23G, a second support arm portion 24G and an electrode portion 25G.

The welding portion 22G of the gate pad 11 forms a top view quadrangle shape, and is configured close to a movable end of one support arm portion 13D of the drain pad 9. The welding portion 22G is electrically connected to the gate terminal 8 through a welding wire 26G (1 connection wire in FIG. 2).

The first support arm portion 23G of the gate pad 11 forms a top view straight line shape, from a corner portion of the welding portion 22G to a movable end of the other support arm portion 13D of the drain pad 9, and is close to a side of the element area 16 relative to the welding portion 18S of the source pad 10 and extends in parallel to the welding portion 12D of the drain pad 9.

The second support arm portion 24G of the gate pad 11 is formed as one piece at two sides of the support arm portion 19S of the source pad 10 respectively in a manner extending in a direction transversely cutting the electrode portion 14D of the drain pad 9 from the start of the first support arm portion 23G, in the gap 17 of the electrode portion 14D of the drain pad 9.

The electrode portion 25G of the gate pad 11 is formed as multiple pieces in a stripe shape extending in two directions from the second support arm portion 24G to the support arm portions 13D of the drain pad 9. An electrode portion 25G is disposed between the electrode portion 14D of the drain pad 9 and each electrode portion 20S of the source pad 10. Furthermore, the interval GD between the electrode portion 25G and the electrode portion 14D is wider than the interval GS between the electrode portion 25G and the electrode portion 20S. That is, the electrode portion 25G is configured at a side close to the electrode portion 20S relative to the middle position between the electrode portion 14D and the electrode portion 20S. Thus, when a positive voltage is applied to the electrode portion 14D at the drain side, and a voltage below 0 (zero) V is applied to the electrode portion 25G at the gate side, full voltage drop can be achieved between the drain and the gate. In this way, electrostatic focusing for the electrode portion 25G can be prevented.

The resin package 4 constitutes the profile of the HEMT package 1, and is formed into a basically cuboid shape. The resin package 4 includes well-known mould resin such as epoxide resin, and covers the base portion 5 of the terminal frame 2, the welding wires 15D, 21S, and 26G, and the HEMT element 3 together with 3 terminals (the source terminal 6, the drain terminal 7 and the gate terminal 8) exposed, thereby sealing the HEMT element 3.

Figure 4:
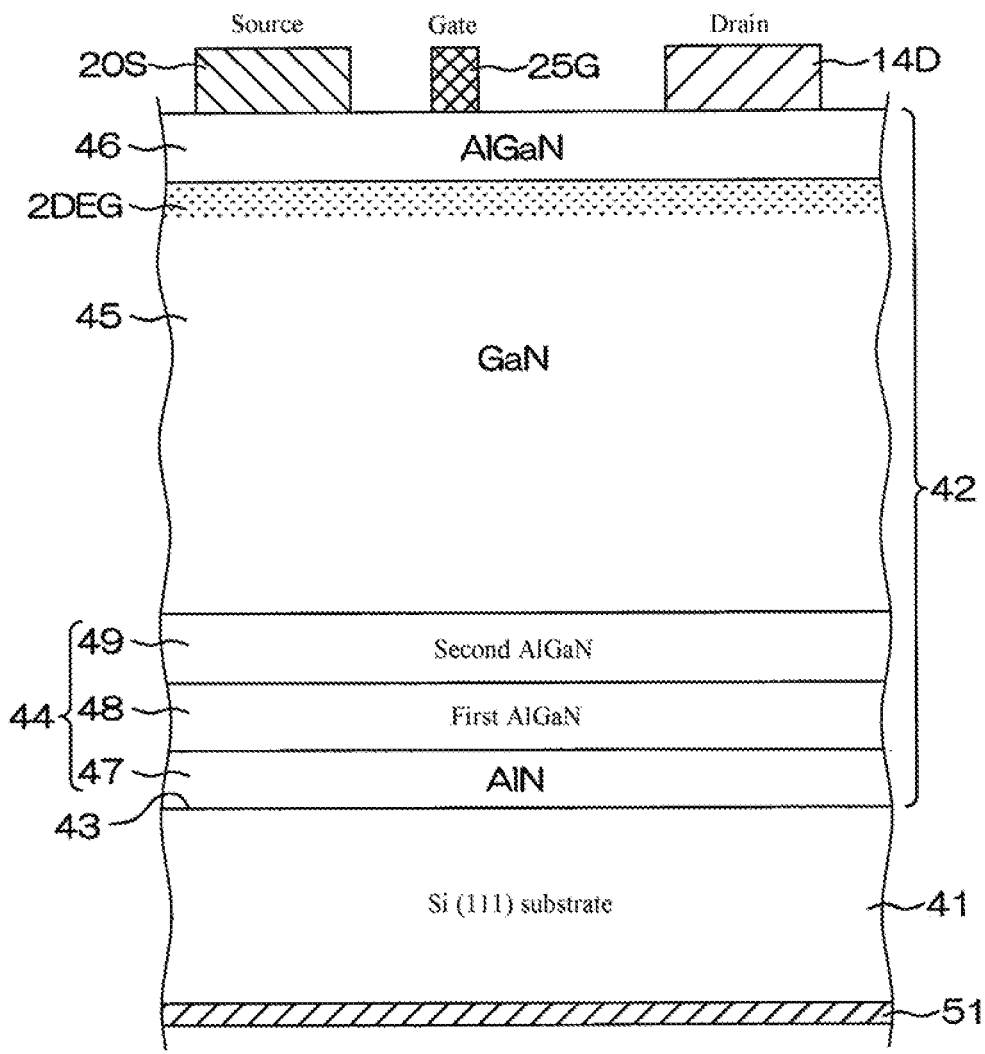
FIG. 4 is a schematic cross-sectional view of an HEMT element according to an implementation manner of the present invention, which denotes the cross section of the B-B cut surface of FIG. 3.

FIG. 4 is a schematic cross-sectional view of an HEMT element according to an implementation manner of the present invention, which denotes a cross section of a B-B cut surface of FIG. 3.

The internal construction of the HEMT element is described in detail below with reference to FIG. 4.

The HEMT element 3 includes a substrate 41 as a semiconductor substrate, and a group III nitride semiconductor deposit layer 42 formed on the substrate 41 through epitaxial growth (crystalline growth).

The substrate 41 in this implementation manner is constituted by a Si monocrystalline substrate (with a linear expansion coefficient $\alpha 1$ of, for example, $2.5 \times 10^{-6}$ to $3.5 \times 10^{-6}$ (293 K)). The substrate 41 is a coaxial (111) plane Si substrate with a (111) plane as a primary surface 43 and a deflection angle of 0°.

The a-axis average lattice constant LC1 (the inter-lattice distance between Si atoms bonded to atoms constituting a nitride semiconductor in the direction of the primary surface 43 of the substrate 41) of the substrate 41 is, for example, 0.768 nm to 0.769 nm. Furthermore, through the crystalline growth on the primary surface 43, the group III nitride semiconductor deposit layer 42 is formed. The group III nitride semiconductor deposit layer 42 includes, for example, a group III nitride semiconductor with the c-plane ((0001) plane) as the primary surface for the crystalline growth.

Misalignment between layers forming the group III nitride semiconductor deposit layer 42 and the lattice at the bottom layer is absorbed through the lattice strain of the crystalline growth layer, thereby ensuring lattice continuity on the interface between the layers and the bottom layer. For example, when the InGaN layer and the AlGaN layer are respectively grown from the c-plane ((0001) plane)) of the GaN layer, the average lattice constant of InGaN in the a-axis direction under the state of no strain (the a-axis average lattice constant) is greater than the a-axis average lattice constant of GaN, so the compression stress (compression strain) is generated on the InGaN layer in the direction facing the a-axis. Accordingly, the a-axis average lattice constant of AlGaN under the state of no strain is lower than the a-axis average lattice constant of GaN, so the tensile stress (tensile strain) is generated on the AlGaN layer in the direction facing the a-axis.

The constitution of the group III nitride semiconductor deposit layer 42 is a buffer layer 44, a GaN electron transfer layer 45, and an AlGaN electron supply layer 46 sequentially laminated from the start of the substrate 41.

The buffer layer 44 is constituted by laminating an AlN layer 47, a first AlGaN layer 48, and a second AlGaN layer 49. In the implementation manner, the deposit layer of the first AlGaN layer 48 and the second AlGaN layer 49 is an example of the AlGaN deposit layer of the present invention. Furthermore, the second AlGaN layer 49 is an example of the reference AlGaN layer of the present invention, and the first AlGaN layer 48 is an example of the AlGaN layer configured on the surface of the AlN layer connected the reference AlGaN layer.

The thickness of the AlN layer 47 is 50 nm to 200 nm, for example, 120 nm. Furthermore, the a-axis average lattice constant LC2 of the AlN layer 47 is, for example, 0.311 nm to 0.312 nm, and the linear expansion coefficient $\alpha 2$ is, for example, $4.1 \times 10^{-6}$ to $4.2 \times 10^{-6}$ (293 K).

The first AlGaN layer 48 in this implementation manner is formed into an undoped AlGaN layer without intentionally added impurities. However, the first AlGaN layer 48 sometimes contains minor unintentional impurities. The thickness of the first AlGaN layer 48 is 100 nm to 500 nm, for example, 140 nm. The average Al component of the first AlGaN layer 48 is 40% to 60% (for example, 50%). The a-axis average lattice constant LC3 of the first AlGaN layer 48 is, for example, 0.314 nm to 0.316 nm, and the linear expansion coefficient $\alpha 3$ thereof is, for example, $4.6 \times 10^{-6}$ to $5.0 \times 10^{-6}$ (293 K).

The a-axis in-plane lattice constant LC3' of the upper surface of the first AlGaN layer 48 (the interface between the first AlGaN layer 48 and the second AlGaN layer 49) is, for example, 0.312 nm to 0.314 nm.

The second AlGaN layer 49 in this implementation manner is formed into an undoped AlGaN layer without impurities intentionally added impurities. However, the second AlGaN layer 49 sometimes contains minor unintentional impurities. The thickness of the second AlGaN layer 49 is 100 nm to 500 nm, for example, 140 nm. Furthermore, the average Al component of the second AlGaN layer 49 is lower than that of the first AlGaN layer 48 by 10% or more, specifically, by 10% to 30% (for example 20%). Furthermore, the a-axis average lattice constant LC4 of the second AlGaN layer 49 is greater than the a-axis in-plane lattice constant LC3' of the upper surface of the first AlGaN layer 48 (the interface between the first AlGaN layer 48 and the second AlGaN layer 49), and lower than the original a-axis average lattice constant (0.316 nm to 0.318 nm) of AlGaN, for example, 0.314 nm to 0.316 nm. Furthermore, the linear expansion coefficient $\alpha 4$ of the second AlGaN layer 49 is, for example, $5.0 \times 10^{-6}$ to $5.4 \times 10^{-6}$ (293 K).

The GaN electron transfer layer 45 in this implementation manner is formed into an undoped GaN layer without intentionally added impurities. However, the GaN electron transfer layer 45 sometimes contains minor unintentional impurities. The a-axis average lattice constant LC5 of the GaN electron transfer layer 45 is, for example, 0.318 nm to 0.319 nm, and the linear expansion coefficient $\alpha 5$ is, for example, $5.5 \times 10^{-6}$ to $5.6 \times 10^{-6}$ (293 K).

Furthermore, the degree of strain of the c-axis lattice constant of the GaN electron transfer layer 45 is, for example, −0.07% or more and below 0 (zero). The degree of strain of the c-axis lattice constant is obtained, for example, by comparing the c-axis lattice constant of the GaN electron transfer layer 45 determined through X-ray diffraction determination, with the original c-axis lattice constant of GaN. As long as the degree of strain of the c-axis lattice constant of the GaN electron transfer layer 45 is in the range, the applied c-axis compression stress can be constrained, so as to prevent generation of alligator cracks.

Figure 5:
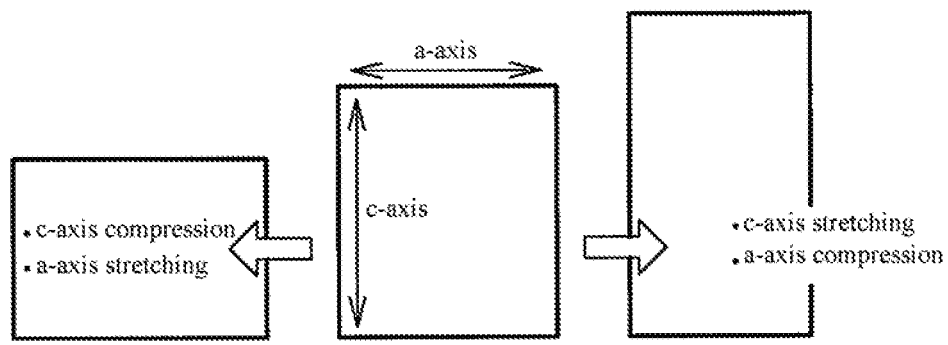
FIG. 5 is an image view of a residual stress generated on a nitride semiconductor layer.

An orthogonal relationship exists between the c-axis and the a-axis. Therefore, as shown in FIG. 5, the compression stress and the tensile stress apply force in opposite directions; that is, whatever direction the compression stress is applied to (for example the c-axis direction), the tensile stress is applied to the opposite direction (for example the a-axis direction).

Therefore, as described above, the degree of strain of the c-axis lattice constant of the GaN electron transfer layer 45 is set to be greater than 0.07% and below 0 (zero), and the c-axis compression stress applied to the GaN electron transfer layer 45 may be constrained, so as to prevent generation of alligator cracks.

The AlGaN electron supply layer 46 in this implementation manner is formed into an undoped AlGaN layer without intentionally added impurities. However, the AlGaN electron supply layer 46 sometimes contains minor unintentional impurities. The a-axis average lattice constant LC6 of the AlGaN electron supply layer 46 is, for example, 0.318 nm to 0.319 nm. Furthermore, the average Al component of the AlGaN electron supply layer 46 is 20% to 30% (for example 25%). Furthermore, the linear expansion coefficient α6 of the AlGaN electron supply layer 46 is, for example, 5.0× $10^{-6}$ to 5.2×$10^{-6}$ (293 K).

In this way, bonding between the GaN electron transfer layer 45 and the AlGaN electron supply layer 46 with components different from each other becomes heterogeneous bonding, and so, on the GaN electron transfer layer 45, two-dimensional (2D) electron gas (2DEG) is generated close to the bonding interface between the GaN electron transfer layer 45 and the AlGaN electron supply layer 46. The 2DEG spreads basically over the entire area close to the bonding interface between the GaN electron transfer layer 45 and the AlGaN electron supply layer 46, and the concentration thereof is, for example, 8×$10^{12}$ $cm^{-2}$ to 2×$10^{13}$ $cm^{-2}$. In the HEMT element 3, a current flow is formed between the source and the drain by utilizing the 2DEG, so as to execute an element action.

On the AlGaN electron supply layer 46, in a manner of being connected to the AlGaN electron supply layer 46, the electrode portion 25G of the gate pad 11, the electrode portion 20S of the source pad 10 and the electrode portion 14D of the drain pad 9 are separately disposed at intervals.

The electrode portion 25G of the gate pad 11 (referred to as a gate electrode 25G hereinafter) may be constituted by an electrode material capable of forming Schottky bonding with the AlGaN electron supply layer 46, for example, Ni/Au (Ni/Au alloy).

The electrode portion 20S of the source pad 10 (referred to as a source electrode 20S hereinafter) and the electrode portion 14D of the drain pad 9 (referred to as a drain electrode 14D hereinafter) both may be constituted by an electrode material capable of achieving ohmic connection with the AlGaN electron supply layer 46, for example, Ti/Al (Ti/Al alloy), Ti/Al/Ni/Au (Ti/Al/Ni/Au alloy), Ti/Al/Nb/Au (Ti/Al/Nb/Au alloy), and Ti/Al/Mo/Au (Ti/Al/Mo/Au alloy).

Furthermore, a back electrode 51 is formed at the back side of the substrate 41. The back electrode 51 is connected to the base portion 5 of the terminal frame 2, so that the potential of the substrate 41 becomes the ground potential. Additionally, the potential of the substrate 41 may also be set to be the same as that of the source electrode 20S, so that the potential of the source electrode 20S becomes the ground potential.

Figure 6:
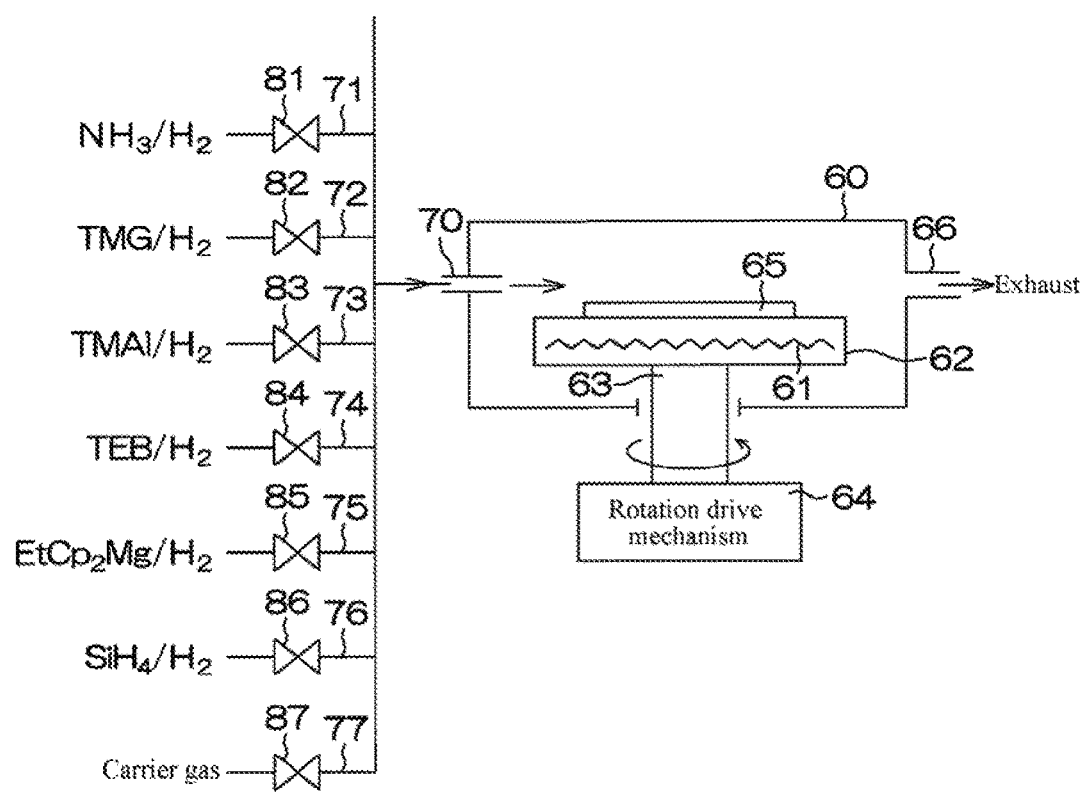
FIG. 6 is a graphical drawing for illustrating the constitution of a processing device used to grow layers constituting a group III nitride semiconductor deposit layer.

FIG. 6 is a graphical drawing illustrating the constitution of a processing device used for growing layers constituting a group III nitride semiconductor deposit layer.

A method for manufacturing a group III nitride semiconductor deposit layer is described in detail below with reference to FIG. 6.

A base 62 equipped with a heater 61 is configured in a processing chamber 60. The base 62 is bound to a rotation axis 63, and the rotation axis 63 is rotated by utilizing a rotation drive mechanism 64 configured outside the processing chamber 60. Thus, a processing object, that is, a chip 65, is maintained on the base 62; the chip 65 may be heated to a specific temperature in the processing chamber 60, and may be rotated. The chip 65 is a Si monocrystalline chip constituting the Si monocrystalline substrate 41.

An exhaustion pipe 66 is connected to the processing chamber 60. The exhaustion pipe 66 is an exhaustion apparatus connected to a rotation pump. Thus, the pressure in the processing chamber 60 is set to 1/10 barometric pressure to atmospheric pressure, so as to continuously perform exhaustion on the processing environment in the processing chamber 60.

In another aspect, a raw material gas supply pipe 70 for supplying raw material gas to the surface of the chip 65 maintained on the base 62 is introduced into the processing chamber 60. The raw material gas supply pipe 70 is connected to a nitrogen raw material pipe 71 for supplying ammonia as nitrogen raw material gas, a gallium raw material pipe 72 for supplying trimethylgallium (TMG) as gallium raw material gas, an Al raw material pipe 73 for supplying trimethylaluminum (TMAl) as Al raw material gas, a boron raw material pipe 74 for supplying Triethyl boron (TEB) as boron raw material gas, a magnesium raw material pipe 75 for supplying ethylcyclopentadienyl magnesium (EtCp$_2$Mg) as magnesium raw material gas, a silicon raw material pipe 76 for supplying silane (SiH$_4$) as silicon raw material gas, and a carrier air pipe 77 for supplying the carrier gas. Valves 81 to 87 are mounted in the multiple raw material pipes 71 to 77 respectively. All raw material gases are supplied together with the carrier gas including hydrogen or nitrogen or both.

For example, the Si monocrystalline chip, with the (111) plane as the primary surface, is used as the chip 65 and maintained on the base 62. In this state, the valves 81 to 86 are closed, and the carrier air valve 87 is opened, so as to supply the carrier gas to the processing chamber 60. Moreover, the heater 61 is powered on to heat the chip to a temperature of 1000° C. to 1100° C. (for example 1050° C.). Thus, a group III nitride semiconductor with the surface coarsely growing cannot be generated.

When the chip temperature reaches 1000° C. to 1100° C. and the heater is on standby, the nitrogen raw material valve 81 and the Al raw material valve 83 are opened. Thus, ammonia and TMAl are supplied together with the carrier gas from the raw material air supply pipe 70. In this way, the AlN layer 47 is formed on the surface of the chip 65 through epitaxial growth.

Then, the first AlGaN layer 48 is formed. That is to say, the nitrogen raw material valve 81, the gallium raw material valve 82 and the Al raw material valve 83 are opened, and the other valves 84 to 86 are closed. Thus, ammonia, TMG and TMAl are supplied to the chip 65, so as to form the first AlGaN layer 48 containing AlGaN. When the first AlGaN layer 48 is formed, the temperature of the chip 65 is properly set to between 1000° C. and 1100° C. (for example 1050° C.).

Then, the second AlGaN layer 49 is formed. That is to say, the nitrogen raw material valve 81, the gallium raw material valve 82 and the Al raw material valve 83 are opened, and the other valves 84 to 86 are closed. Thus, ammonia, TMG and TMAl are supplied to the chip 65, so as to form the second AlGaN layer 49 containing AlGaN. When the second AlGaN layer 49 is formed, the temperature of the chip 65 is properly set to between 1000° C. and 1100° C. (for example 1050° C.).

Afterwards, the GaN electron transfer layer 45 is formed. When the GaN electron transfer layer 45 is formed, the nitrogen raw material valve 81 and the gallium raw material valve 82 are opened, and ammonia and TMG are supplied to the chip 65, thereby growing the GaN layer. When the GaN electron transfer layer 45 is formed, the temperature of the chip 65 is properly set to, for example, between 1000° C. and 1100° C. (for example 1050° C.).

Then, the AlGaN electron supply layer 46 is formed. That is to say, the nitrogen raw material valve 81, the gallium raw material valve 82 and the Al raw material valve 83 are opened, and the other valves 84 and 85 are closed. Thus, ammonia, TMG and TMAl are supplied to the chip 65, so as to form the AlGaN electron supply layer 46. When the AlGaN electron supply layer 46 is formed, the temperature of the chip 65 is properly set to between 1000° C. to 1100° C. (for example 1050° C.).

Subsequently, the chip 65 is placed at room temperature for 20 min to 60 min for cooling. In this way, the group III nitride semiconductor deposit layer 42 is formed.

As described above, according to this implementation manner, the buffer layer 44 formed by sequentially laminating the AlN layer 47, the first AlGaN layer 48 (with an average Al component of 50%) and the second AlGaN layer 49 (with an average Al component of 20%) is disposed on the Si monocrystalline substrate 41, and the GaN electron transfer layer 45 is connected to the primary surface (c-plane) of the second AlGaN layer 49.

Thus, the a-axis average lattice constant from the AlN layer 47 to the GaN electron transfer layer 45 is continuously increased from LC2 (0.311 nm), LC3 (0.314 nm) and LC4 (0.316 nm) to the value close to the a-axis average lattice constant LC5 (0.318 nm) of the GaN electron transfer layer in a periodic manner. Therefore, the difference in a-axis average lattice constant (LC5−LC4) between the GaN electron transfer layer 45 and the second AlGaN layer 49 connected to the GaN electron transfer layer 45 may be reduced. In this way, the GaN electron transfer layer 45 can be freely designed in terms of thickness. Therefore, the GaN electron transfer layer 45 can be designed to be thick, so as to improve the voltage tolerance performance of the HEMT element 3.

Furthermore, the compression stress applied to the first AlGaN layer 48 due to the difference in a-axis average lattice constant (LC3−LC2) between the AlN layer 47 and the first AlGaN layer 48 may be transferred to the second AlGaN layer 49. Thus, the a-axis average lattice constant LC4 of the second AlGaN layer 49 is greater than the a-axis in-plane lattice constant LC3' of the first AlGaN layer 48 connected to the second AlGaN layer 49, and is lower than the original a-axis average lattice constant of the second AlGaN layer 49. That is, the a-axis compression stress due to inconsistency of the a-axis in-plane lattice constant LC3' of the first AlGaN layer 48 is applied to the second AlGaN layer 49. Furthermore, the a-axis compression stress may be applied to the GaN electron transfer layer 45.

Therefore, during or after cooling after the group III nitride semiconductor deposit layer 42 is formed, even if the tensile stress is generated on the GaN electron transfer layer 45 due to the difference in linear expansion coefficient (α5−α1) between the substrate 41 and the GaN electron transfer layer 45, the tensile stress may also be mitigated by applying the compression stress to the GaN electron transfer layer 45 from the second AlGaN layer 49.

In this way, as described above, the degree of strain of the c-axis lattice constant of the GaN electron transfer layer 45 may be set to be higher than −0.07% and below 0 (zero); that is to say, the GaN electron transfer layer 45 can be maintained in a state wherein the a-axis tensile stress is applied such that alligator cracks are not generated. Therefore, the problems of alligator cracks appearing in the GaN electron transfer layer 45 and warping of the substrate 41 can be alleviated.

The above embodiment serves to illustrate one implementation manner of the present invention, but the present invention may also be implemented through other manners.

Figure 7:
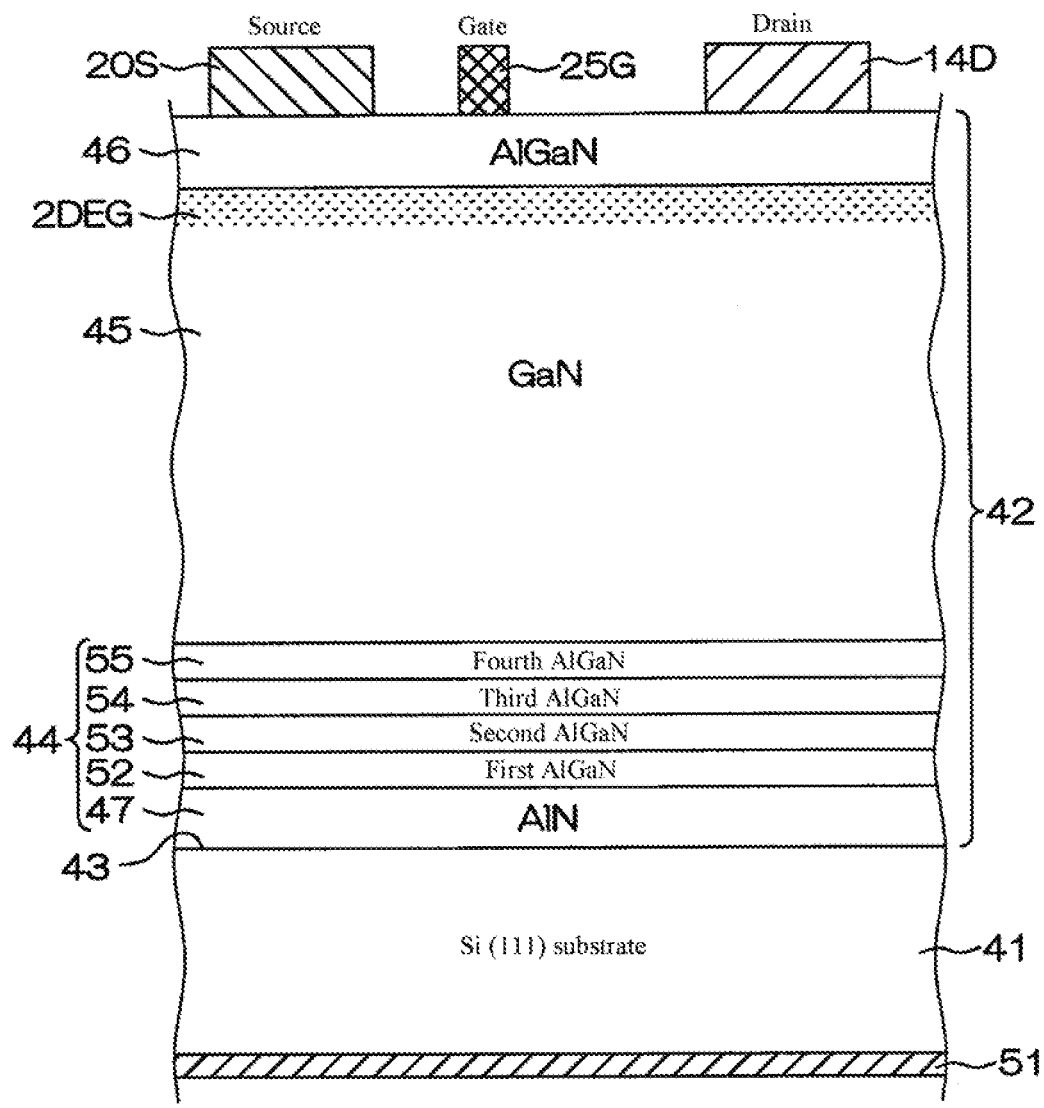
FIG. 7 is a drawing illustrating a deformed example of the AlGaN deposit layer of FIG. 4.

For example, the AlGaN deposit layer of the buffer layer 44 is not necessarily constituted by two AlGaN layers 48 and 49 having different Al components; it may for example also be constituted by the first AlGaN layer 52 (with an average Al component of, for example 80%), the second AlGaN layer 53 (with an average Al component of, for example, 60%), the third AlGaN layer 54 (with an average Al component of, for example, 40%) and the fourth AlGaN layer 55 (with an average Al component of, for example, 20%) sequentially laminated from the start of the AlN layer 47 as shown in FIG. 7. Alternatively, the AlGaN deposit layer may be constituted by laminating three AlGaN layers, five AlGaN layers, or more than five AlGaN layers with different Al components.

Furthermore, various design modifications may be implemented within the scope recorded in the Claims.

The present invention is described below based on an embodiment for purpose of illustration without limitation.

The aim of the embodiment is to confirm the changes in degree of strain of the c-axis lattice constant of the GaN electron transfer layer and the lattice constant of the second AlGaN layer induced by the change of the Al component of the second AlGaN layer.

First, on a surface of a Si monocrystalline substrate with the (111) plane as the primary surface, the AlN layer (with a thickness of 120 nm) is formed through epitaxial growth. Then, the first AlGaN layer (average Al component being 50% and the thickness being 140 nm) and the second AlGaN layer (average Al component being 10% and the thickness being 140 nm) are sequentially generated through epitaxial growth. Thus, the buffer layer is formed.

Figure 8:
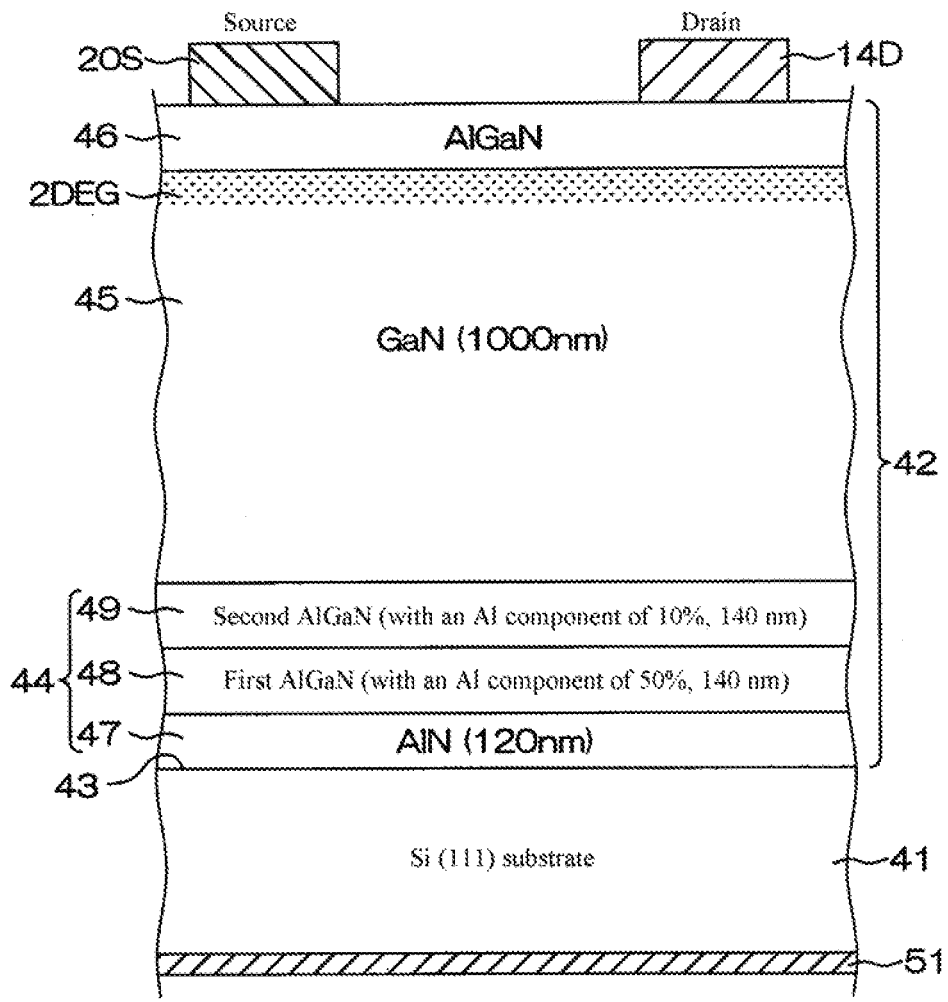
FIG. 8 is a schematic cross-sectional view denoting the constitution of an HEMT element according to an embodiment.

Afterwards, the GaN electron transfer layer (with a thickness of 1000 nm) and the AlGaN electron supply layer are sequentially formed on the second AlGaN layer, thereby manufacturing the group III nitride semiconductor deposit layer as shown in FIG. 8. Subsequently, a source electrode and a drain electrode are formed on the AlGaN electron supply layer.

Likewise, a group III nitride semiconductor deposit layer with the second AlGaN layer with an Al component of 17% and 25% in place of the second AlGaN layer with an average Al component of 10% is manufactured.

<Evaluation>

(1) Determination of the c-Axis Degree of Strain of the GaN Electron Transfer Layer X-ray diffraction determination is performed on the GaN electron transfer layer of the group III nitride semiconductor deposit layer obtained in the embodiment, so as to determine the c-axis lattice constant of the GaN electron transfer layer. Thus, the direction and the magnitude of the residual stress applied to the GaN electron transfer layer are evaluated. The result is shown in FIG. 9.

Figure 9:
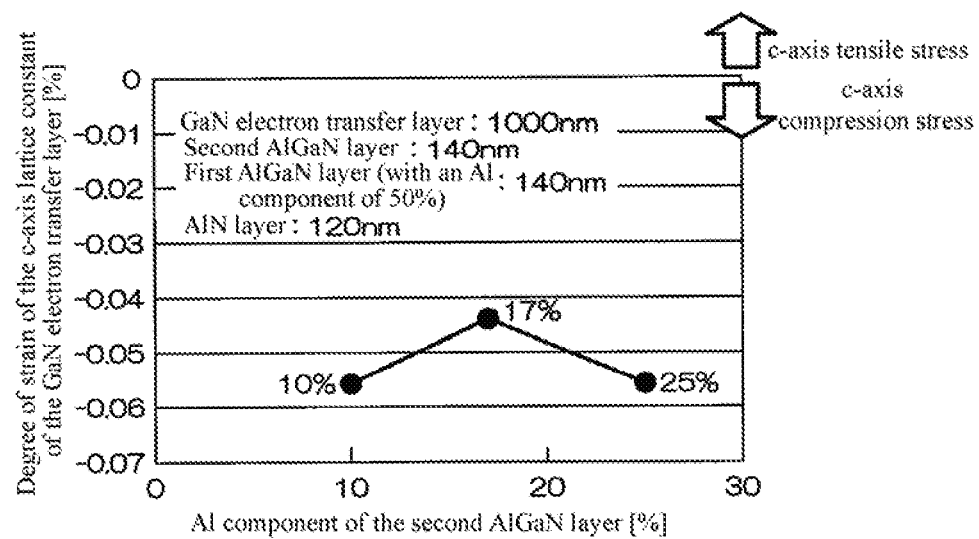
FIG. 9 is a chart denoting the degree of strain of the c-axis lattice constant of the GaN electron transfer layer according to an embodiment.

It can be ascertained from FIG. 9 that no matter what the average Al component of the second AlGaN layer is, the residual stress of the GaN electron transfer layer is compressed relative to the c-axis (stretched relative to the a-axis). It is considered that this case is caused due to the difference in linear expansion coefficient between the Si monocrystalline substrate and the GaN electron transfer layer.

That is, although the a-axis tensile stress is applied to the GaN electron transfer layer, the c-axis degree of strain is higher than −0.07; in other words, it is determined that the a-axis tensile stress is of a proper magnitude without causing generation of alligator cracks on the GaN electron transfer layer.

Furthermore, it can be ascertained that when average Al component of the second AlGaN layer is 17%, the residual stress of the GaN electron transfer layer is lowest; this is the optimal value of the three embodiments.

(2) Determination of the Lattice Constant of the Second AlGaN Layer

Figure 10:
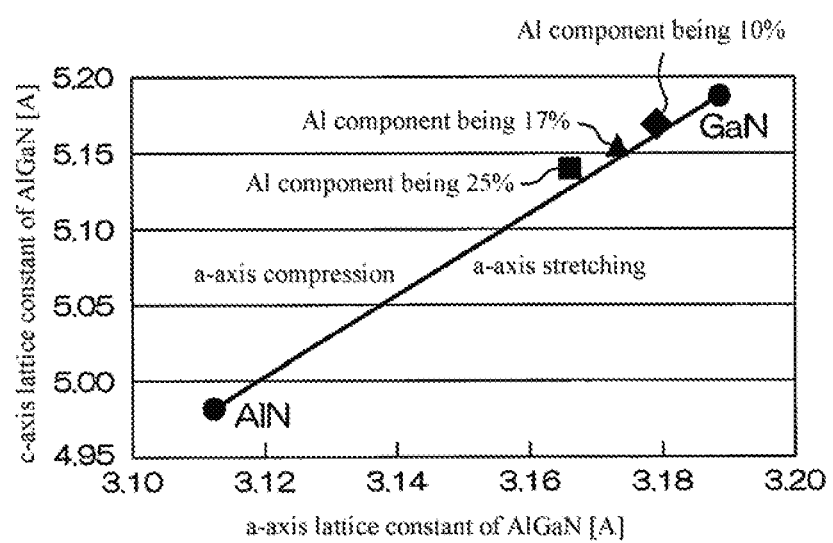
FIG. 10 is a chart denoting the lattice constant of the second AlGaN layer according to an embodiment.

X-ray diffraction determination is performed on the second AlGaN layer of the group III nitride semiconductor deposit layer obtained in the embodiment, so as to determine the a-axis lattice constant of the second AlGaN layer. The result is shown in FIG. 10. Table 1 shows the difference in a-axis lattice constant between the second AlGaN layer and the GaN electron transfer layer.

TABLE 1

| Average Al component (%) | Difference in a-axis lattice constant between the second AlGaN layer and the GaN electron transfer layer (%) |
| --- | --- |
| 10 | 0.34 |
| 17 | 0.62 |
| 25 | 0.91 |

In FIG. 10, the straight line denotes a relationship between the original c-axis lattice constant and the original a-axis lattice constant of the AlGaN layer. The ink dot at the left side of the straight line signifies that the AlGaN layer denoted by the ink dot is subject to the a-axis compression stress, and the ink dot at the right side signifies that the AlGaN layer denoted by the ink dot is subject to the a-axis tensile stress. Furthermore, the distance between the straight line and the ink dot denotes the magnitude of the stress. That is, the larger the distance between the straight line and the ink dot, the greater the stress applied to the AlGaN layer denoted by the ink dot.

It can be known from FIG. 10 that no matter what the average Al component of the second AlGaN layer is, a proper a-axis compression stress is applied to the second AlGaN layer. Thus, it is determined that the a-axis compression stress acts on the GaN electron transfer layer, so as to mitigate the tensile stress caused due to the difference in linear expansion coefficient between the Si monocrystalline substrate and the GaN electron transfer layer.

Although the technical contents and features of the present disclosure are described above, various replacements and modifications can be made by persons skilled in the art based on the teachings and disclosure of the present description without departing from the spirit thereof. Therefore, the scope of the present disclosure is not limited to the described embodiments, but covers various replacements and modifications that do not depart from the present disclosure as defined by the appended claims.

What is claimed is:

1. A nitride semiconductor element, comprising:
    a Si substrate including a primary surface;
    a buffer layer comprised of an AlGaN laminated structure formed by laminating multiple AlGaN layers, the buffer layer having a primary surface which has a c-plane orientation;
    a Group III-nitride electron transfer layer formed on the AlGaN laminated structure; and
    a Group III-nitride electron supply layer formed on the Group III-nitride electron transfer layer,
    wherein the AlGaN laminated structure includes a reference AlGaN layer, and an AlGaN layer that is closer to the Si substrate, and
    wherein the reference AlGaN layer has an a-axis average lattice constant, the AlGaN layer arranged in contact with a surface of the reference AlGaN layer has an a-axis in-plane lattice constant, wherein the surface of the reference AlGaN layer faces the Si substrate, and wherein the a-axis average lattice constant of the reference AlGaN layer is greater than the a-axis in-plane lattice constant of the AlGaN layer arranged in contact with the surface of the reference AlGaN layer, and lower than an original a-axis average lattice constant of the reference AlGaN layer.

2. The nitride semiconductor element of claim 1, further comprising an AlN layer formed on the primary surface of the Si substrate, wherein
    the AlGaN laminated structure is formed by laminating multiple AlGaN layers on the AlN layer;
    the AlGaN layer arranged in contact with the surface of the reference AlGaN layer is closer to the AlN layer than the reference AlGaN layer; and
    the surface of the reference AlGaN layer faces the AlN layer.

3. The nitride semiconductor element of claim 1, wherein the reference AlGaN layer has an Al component that is lower than the Al component of the AlGaN layer that is closer to the Si substrate.

4. The nitride semiconductor element according to claim 3, wherein, in the AlGaN laminated structure, the difference in Al component between the reference AlGaN layer and the AlGaN layer arranged in contact with the surface of the reference AlGaN layer is 10% or more.

5. The nitride semiconductor element according to claim 3, wherein the Al component of the AlGaN layer is 50% and the Al component of the reference AlGaN layer is 10%.

6. The nitride semiconductor element according to claim 3, wherein the Al component of the AlGaN layer is 50% and the Al component of the reference AlGaN layer is 17%.

7. The nitride semiconductor element according to claim 3, wherein the Al component of the AlGaN layer is 50% and the Al component of the reference AlGaN layer is 20%.

8. The nitride semiconductor element according to claim 3, wherein the Al component of the AlGaN layer is 50% and the Al component of the reference AlGaN layer is 25%.

9. The nitride semiconductor element according to claim 2, wherein the AlN layer has a first a-axis average lattice constant, the Group III-nitride electron transfer layer has a second a-axis average lattice constant, and the a-axis average lattice constant of the reference AlGaN layer and the a-axis in-plane lattice constant of the AlGaN layer are greater than the first a-axis average lattice constant and smaller than the second a-axis average lattice constant.

10. The nitride semiconductor element according to claim 9, wherein the first a-axis average lattice constant, the a-axis in-plane lattice constant of the AlGaN layer, the a-axis average lattice constant of the reference AlGaN layer, and the second a-axis average lattice constant are monotonic increasing values.

11. The nitride semiconductor element according to claim 1, wherein the reference AlGaN layer is arranged to compress the Group III-nitride electron transfer layer in a-axis.

12. The nitride semiconductor element according to claim 1, wherein the AlGaN layer is arranged to compress the reference AlGaN layer in a-axis.

13. The nitride semiconductor element according to claim 2, wherein the AlN layer is stretched by the AlGaN layer in a-axis.

14. The nitride semiconductor element according to claim 1, wherein the primary surface of the Si substrate is a (111) plane.

15. The nitride semiconductor element according to claim 1, wherein the Group III-nitride electron transfer layer has a c-axis lattice constant which has a degree of strain that is −0.07% or more.

16. The nitride semiconductor element according to claim 1, wherein the Group III-nitride electron transfer layer has a thickness of 500 nm to 2000 nm.

17. The nitride semiconductor element according to claim 1, wherein the Group III-nitride electron supply layer has a thickness of 500 nm to 2000 nm.

18. The nitride semiconductor element according to claim 2, wherein the AlN layer has a thickness of 50 nm to 200 nm.

19. The nitride semiconductor element according to claim 1, wherein the AlGaN layer has a thickness of 100 nm to 500 nm.

20. The nitride semiconductor element according to claim 1, wherein the reference AlGaN layer has a thickness of 100 nm to 500 nm.

21. A nitride semiconductor package, comprising:
   a nitride semiconductor element according to claim 1; and
   a resin package that covers the nitride semiconductor element.

* * * * *